Dec. 30, 1958 W. L. CLARKE 2,866,201

AUTOMATIC ARTICLE INSERTING APPARATUS

Filed April 26, 1957 5 Sheets-Sheet 1

INVENTOR.
WILLIAM L. CLARKE

BY Marshall M. Truex

ATTORNEY

Dec. 30, 1958 W. L. CLARKE 2,866,201

AUTOMATIC ARTICLE INSERTING APPARATUS

Filed April 26, 1957 5 Sheets-Sheet 2

AUTOMATIC ARTICLE INSERTING APPARATUS

Filed April 26, 1957 5 Sheets-Sheet 3

Dec. 30, 1958 W. L. CLARKE 2,866,201

AUTOMATIC ARTICLE INSERTING APPARATUS

Filed April 26, 1957 5 Sheets-Sheet 4

Dec. 30, 1958 W. L. CLARKE 2,866,201

AUTOMATIC ARTICLE INSERTING APPARATUS

Filed April 26, 1957 5 Sheets-Sheet 5

2,866,201

AUTOMATIC ARTICLE INSERTING APPARATUS

William L. Clarke, Lake Katrine, N. Y., assignor to International Business Machines Corporation, New York, N. Y., a corporation of New York Application April 26, 1957, Serial No. 655,433

12 Claims. (Cl. 1—104)

This invention relates to automatic article inserting apparatus and is directed more particularly to a machine for selectively positioning a printed circuit board with respect to a component inserting tool and causing components of predetermined value to be inserted in selected positions of the card, thereby making an assembly.

Printed circuit boards are well known in the art and comprise a strip of suitable insulating material having a fixed number of regularly spaced positions to receive components and having electrical circuits arranged thereon connecting predetermined ones of the positions according to the pattern desired. The positions used and the printed wiring vary from one type circuit to another, for example, cathode follower to inverter, and the components such as resistors, condensers and coils vary accordingly, both as to type and value. Therefore, it becomes necessary to predetermine which combination of positions and which components are to be used on a given type assembly before a machine can automatically insert such devices.

In general, the procedure and equipment required for manufacture of such boards with components inserted to complete circuits involves considerable labor which greatly increases the cost of manufacture. Furthermore, the degree of skill of the labor required for such an operation increases the cost of assembly. Accordingly, apparatus for presenting work in the form of printed boards to an inserting tool should be simple in construction, automatic in operation, and easily adaptable to progrem change from one type assembly to another. The apparatus of the present invention is arranged to automatically assemble electrical components on a printed circuit board in response to an easily and quickly settable program device.

Briefly stated, a component inserting tool is set in a fixed position, and a carriage which holds a board of the type described is movable relative to the inserting tool. The carriage serves to feed the board and present each inserting position in serial fashion to the inserting tool, while wiping a brush across a commutator having a segment corresponding to each component position on the board. A set of insert switches, each corresponding to a board position are arranged in circuits with their respective commutator segments in a manner such that components are caused to be inserted in the card in positions corresponding to the actuated switches. Furthermore, other sets of switches arranged in a selection matrix are provided to select one of a plurality of values of components for transfer to the inserting tool in subsequent inserting operations for each selected board position.

An object of the invention is to provide a new and improved article assembling apparatus.

Another object of the invention is to provide new and improved apparatus for assembling components with printed circuit boards used in conjunction with electronic apparatus.

It is another object of the invention to provide an improved machine of the above character which carries out the assembly operations automatically in response to a predetermined program.

It is another object of the invention to provide an improved machine of the above character which can be operated by inexperienced and unskilled labor.

It is a still further object of this invention to provide an improved component inserting machine which is free from complicated adjustment when converting from one type circuit to another.

It is another object of the invention to provide improved means for automatically inserting a given type component in any or all positions of a printed circuit board merely by actuation of the switches with no other mechanical change required between types of assemblies to be run.

It is an object of this invention to provide apparatus for assembling components in predetermined locations on a board comprising an inserting tool adapted to insert a component in a board location at a reference position, a mechanism for feeding a board location by location to the reference position, a number of settable control elements, one for each component-receiving position, and devices actuated in response to the arrival at each location on the board at the reference position and to the setting of the corresponding control element for stopping the feeding mechanism and operating the inserting tool.

It is a still further object of the invention to provide improved apparatus for automatic assembly of electrical components of various predetermined values on a printed circuit board in combinations of positions according to a predetermined program.

It is an object of the invention to provide improved apparatus for inserting components in a printed circuit board comprising an inserting tool, switches operated in a predetermined manner, a selection synchronizer for sequentially testing the status of the switches, a mechanism for advancing the card past the inserting tool, a supply of components of at least two types, apparatus for selecting components according to the manner in which the switches are set and for moving selected ones of the components to the inserting tool, and apparatus for stopping the carriage and causing insertion of the selected components in the selected position in the board according to the manner in which the switches are set.

Other objects of the invention will be pointed out in the following description and claims and illustrated in the accompanying drawings, which disclose by way of example, the principle of the invention and the best mode which has been contemplated of applying that principle.

Figure 7:
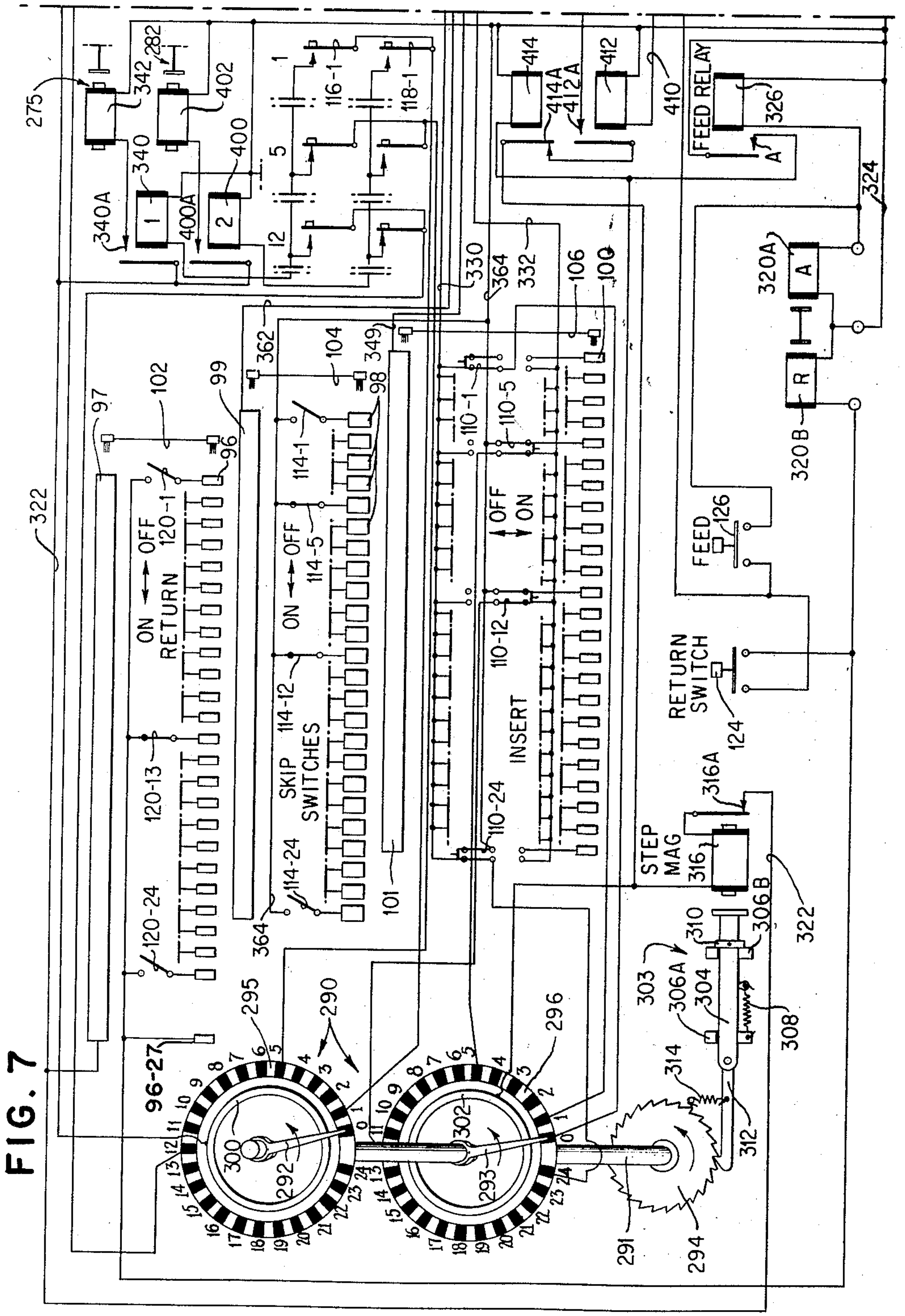
Figure 8:
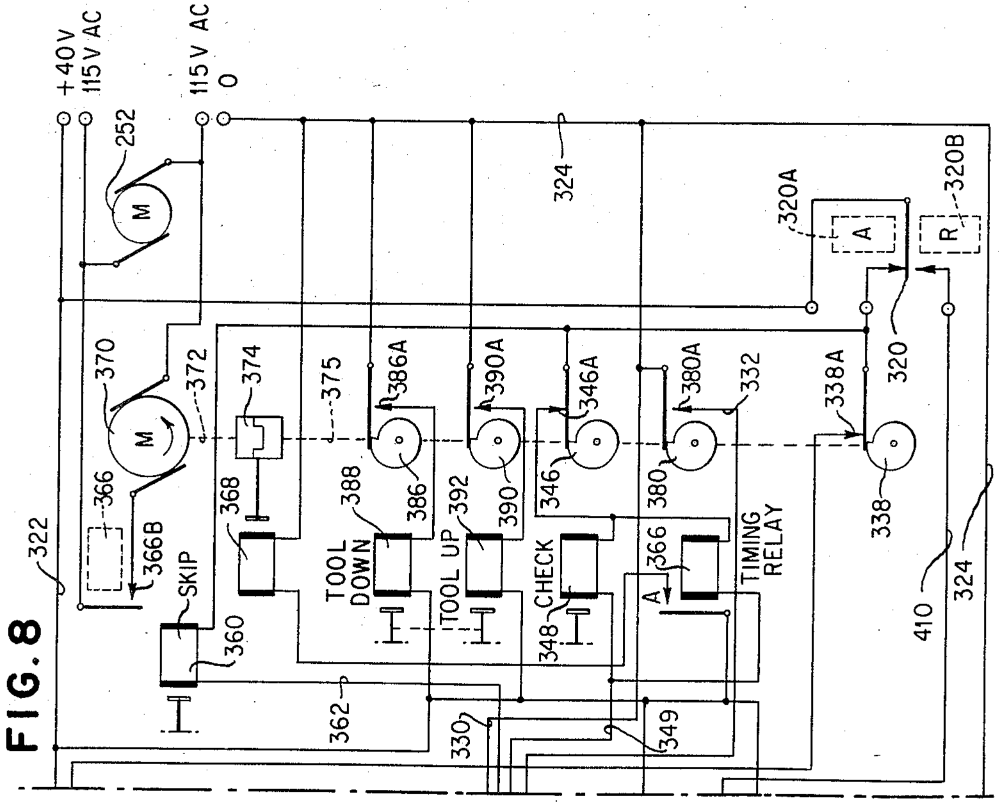

Figures 7 and 8 taken together comprise a circuit diagram of the component inserting apparatus.

Figure 9:
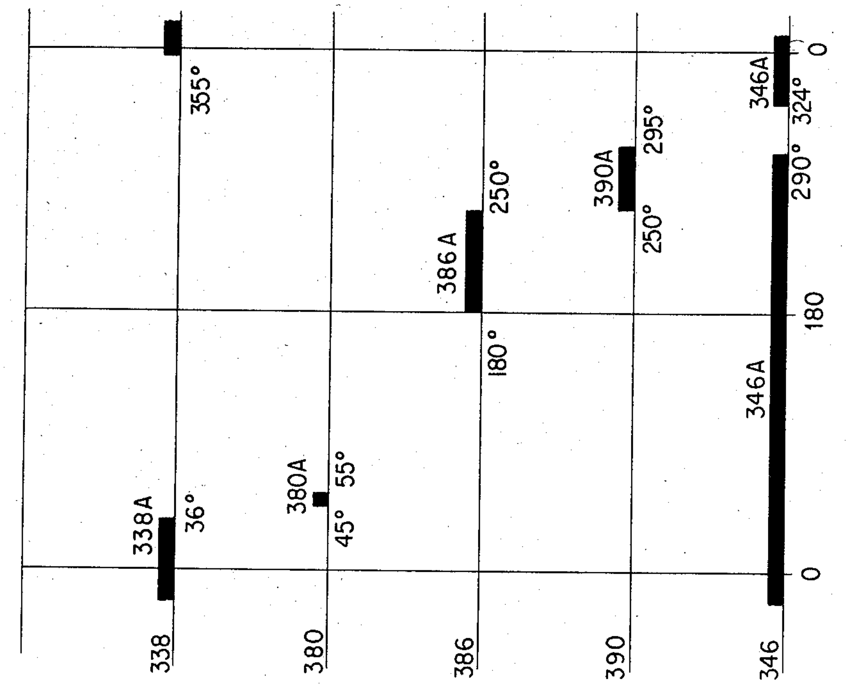

Figure 9 is a sequence chart of one inserting cycle.

Figure 1:
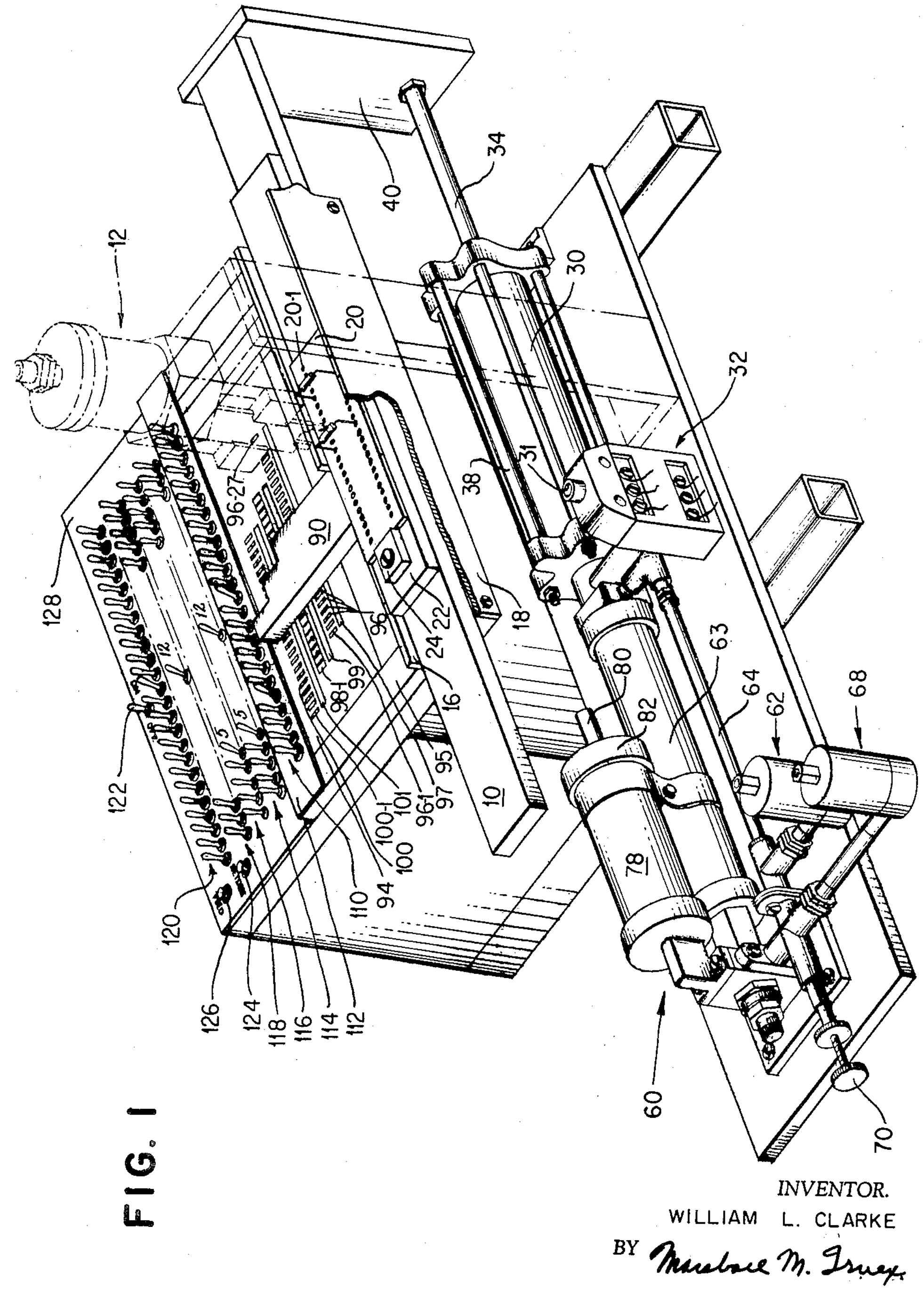
Figure 1 is a perspective view of the component inserting apparatus with certain parts removed.

In Figure 1, there is shown a portion of one embodiment of the machine comprising a carriage 10 which passes under a stationary component inserting tool 12. The carriage is positioned laterally by a pair of guides 16 and 18 which are fixed to the machine base. A board 20 rests upon a pallet 22 secured to the carriage and is supported laterally by the guides 16 and 18 and positioned longitudinally by a block 24 fixed to the pallet 22. The guide 18 resiliently forces the board 20 against the fixed guide 16. An air cylinder 30 of a type well known in the art furnishes motive power to the carriage both on the feed stroke from left to right in Figure 1 and on the return stroke. Compressed air is supplied through an opening 31 to a solenoid operated valve assembly 32, the pump or source of pressure not being shown in the drawings. As will be explained later, a pair of solenoids within the valve assembly 32 causes air to be supplied within the air cylinder chamber to drive the piston (not shown) and a rod 34 from left to right on the feeding stroke and causes air to be supplied through the tube 38 to the air chamber to drive the piston and rod 34 from right to left on the return stroke. It will be understood that the solenoid assembly 32 operates in the well known manner and that when air is supplied to one side of the chamber an exhaust port is opened in the opposing side of the chamber. A member 40 couples the rod 34 to the carriage 10.

The air cylinder 30 is under control of a commercially available hydraulic cylinder assembly, referred to generally with the number 60, having integral blocking by means of a check valve 62. When energized, the air cylinder piston moves a piston in a hydraulic cylinder 63 through its respective bore in the same direction that the rod 34 is caused to move. For example, as the air cylinder piston moves from left to right, the hydraulic cylinder piston is caused to move in the same direction, which movement displaces oil through a transfer tube 64, past the check valve 62, past a skip valve 68, and into the rear of the cylinder behind the piston. The rate of flow is determined by the setting of a knurled knob 70, which controls the size of the passage through an associated needle valve. Hence, the rate at which the piston is advanced may be controlled very accurately.

A balance cylinder 78 is connected by a suitable passage to the rear of the hydraulic cylinder and contains a piston (not shown) attached to a rod 80. A spring (not shown) is positioned about the rod 80 within the cylinder and resiliently engages the piston and the cap 82 to exert a force to the left as viewed in Figure 1. The balance cylinder 78 acts as a reservoir for the volume of oil displaced by the piston rod on the feed stroke and returns this amount of oil to the main cylinder on the return stroke.

As the oil flows through the transfer tube 64 during the feed stroke, closing the check valve 62, interrupts the flow of oil and stops the piston rod and the air cylinder movement until the check valve is released. The skip valve 68 normally does not impede the flow of oil so that the rate of flow is at a maximum as determined by the setting of the knurled knob 70. However, when the skip valve 68 is operated, the size of the orifice is reduced by operation of a needle valve thereby causing slower movement of the air cylinder. The skip valve 68 and the check valve 62 are solenoid operated in the well known manner by application of voltage to the coils as later described with reference to the circuits of Figures 7 and 8. On the return stroke, a one way valve contained in the hydraulic piston permits the oil to flow freely through the latter from left to right as viewed in the drawing. Specific details of the structure of the hydraulic cylinder and associated controls are believed to be unnecessary since such devices are widely used and commercially available.

In Figure 1, the carriage 10 carries an arm 90 for movement therewith. Extending beneath the arm 90 is an insulating plate 94 which is secured to the machine base by a frame 95. Constructed within the insulating material of plate 94 are three commutators, namely, a carriage return commutator 96 having a common strip 97, a skip commutator 98 having a common strip 99 and a check commutator 100 having a common strip 101. Each commutator comprises the common strip and 24 segments of conductive material with the carriage return commutator having an additional segment 96-27 for a purpose to be described later. The arm 90 carries three sets of brushes on its underside, one set for each commutator. As shown diagrammatically in Figure 7, a brush assembly 102 is arranged to sweep the carriage return commutator 96 upon carriage movement; a brush pair 104 of like construction sweeps the skip commutator 98; and a brush pair 106 sweeps the check commutator 100. The arm 90 is positioned such that the brushes 102, 104 and 106 are in contact with the 96-1, 98-1 and 100-1 segments and their respective commons when the 20-1 position of the card is directly beneath the inserting tool 12. In like manner, each segment is associated with a card position from 1 through 24. The commutators are connected to circuits as shown in Figures 7 and 8 in a manner to be described subsequently. A set of check switches 110-1 through 24, shown diagrammatically in Figure 7, are those switches illustrated in Figure 1 as being mounted on a panel 112 fixed to the frame 96, and each switch corresponds to a position on the board and a commutator position, for example, switch 110-1 is related to board position 20-1 and to segment 100-1.

A set of skip switches 114-1 through 114-24, two sets of component selection switches 116-1 through 116-24 and 118-1 through 118-24, a set of carriage return switches 120-1 through 120-24, a return switch 124, and a feed switch 126 also shown diagrammatically in Figure 7 are those switches illustrated in Figure 1 as being mounted in a plate 128. An On-Off switch 122 is shown in Figure 1 for controlling the voltages shown in Figure 8. The electrical connections are shown in Figures 7 and 8 and will be described in connection with the circuits. It will be understood that each of the sets of 24 switches have corresponding ones of each set of switches associated with the board positions as previously described in regard to the check switches 110.

Figures 2, 3, 4, 5:
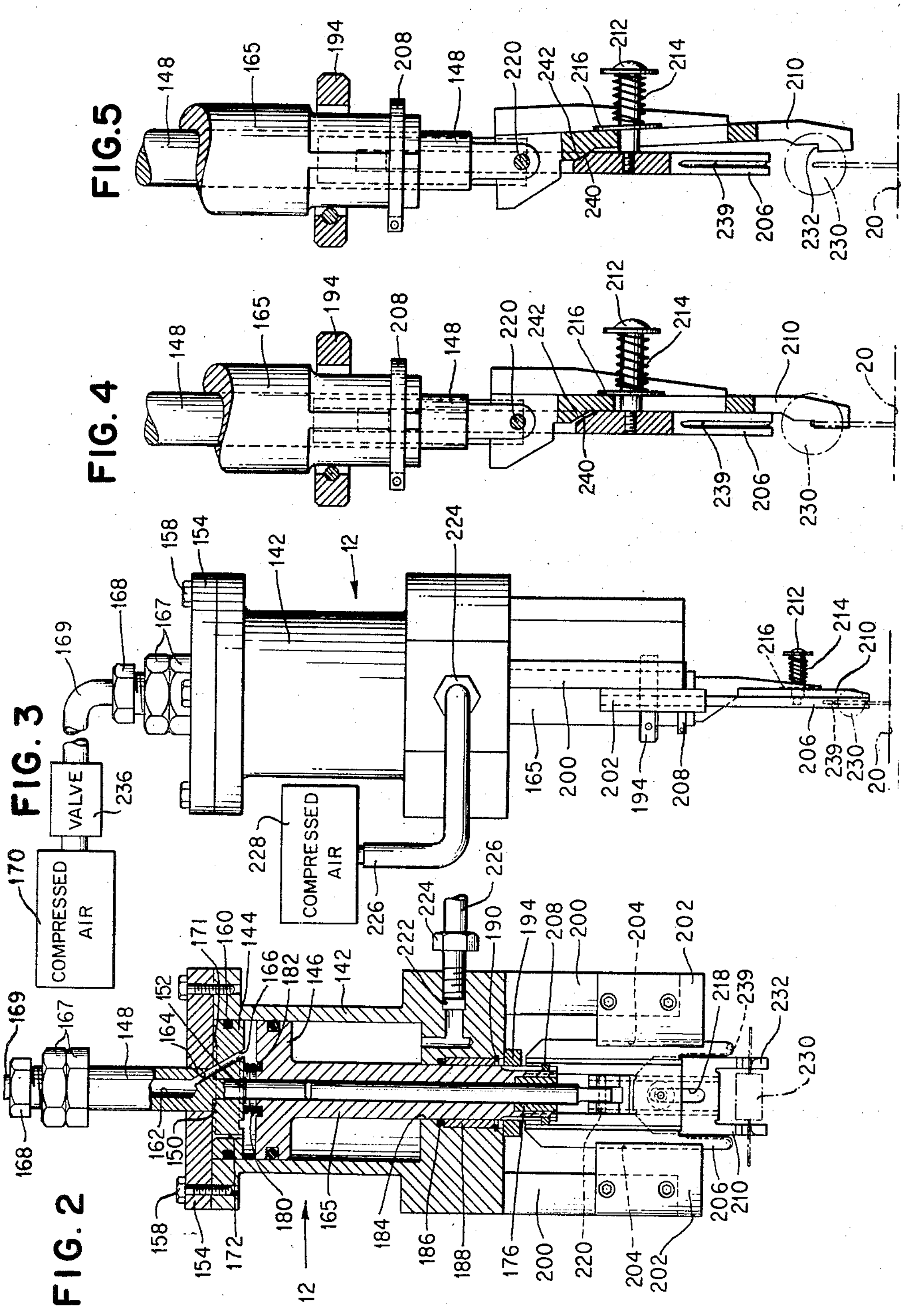
Figure 2 is a section of the inserting tool which is shown in phantom in Figure 1.
Figure 3 is a side view of the inserting tool of Figure 2 with the component forming device in the closed position.
Figure 4 is a side view of a portion of the inserting tool, partly in section, illustrating the first step in releasing the component.
Figure 5 is a side view of the inserting tool, partly in section, illustrating the second step in releasing the component.

With reference to Figure 2, there is shown the inserting tool 12 which is described and claimed in the copending application of H. K. Hazel, Serial No. 656,243, filed May 1st, 1957. A cylinder housing 142 contains within its bore a top piston 144 and a bottom piston 146, each piston having the usual piston ring for engagement with the cylinder walls in the well known manner. A piston rod 148 is passed through a central opening of the top piston 148 and is held to the latter by a hub face 150 and a snap ring 152. The portion of the largest diameter of the piston rod 148 passes through a central opening in a housing top 154, which is secured to the housing with screws 158. A piston ring 160 engages the walls of the cylindrical housing 142. An opening 162 extends axially from the top of the piston rod 148 to an opening 164 of reduced diameter, the latter extending downwardly from the opening 162 to the face of the piston 144. In alignment with the opening 162 is an opening 166 through the piston 144. The upper end of the piston rod 148 is threaded to receive a pair of hex nuts 167, the latter serving to adjustably limit the downward travel of the piston 144 and the rod 148 by engagement with the housing top 154. The threads also receive a connector 168, which couples an air hose 169 to the opening 162. With the arrangement of parts, air under pressure supplied from a source 170 through an open valve enters the chamber between pistons 144 and 146.

A circular groove 171 is cut in the upper face of the piston 144, and an orifice 172 extends from the groove 171 through the width of the piston 144. The diameter of the orifice 172 is less than the diameter of the openings 164 and 166 in the piston rod 148 and piston 144 respectively.

The bottom piston 146 has an integral rod 165 extending downwardly through the cylinder, and the piston rod 148 extends through an axial opening in the former with the seal ring positioned in a groove of the rod 148. A cylindrical bearing 176 is fixed within the lower portion of the rod 165 and engages the rod 148. A spring 180 is positioned about the rod 148 between the pistons and is held in a groove 182 in the upper surface of the piston 146. In the position shown in Figure 1, the spring is slightly compressed between the two pistons.

The rod 165 and the coaxial rod 148 pass through an opening 184 in the lower end of the cylinder housing. A seal ring 186 is positioned by a groove in the opening 184 and engages the rod 165, while a cylindrical bearing 188 contained in the housing with a snap ring 190 furnishes guiding support for the piston rod 165. A stop ring 194 is fixed to the rod 165 and limits the upward travel of the piston 146.

A pair of brackets 200 extends below the housing and supports a pair of guide blocks 202 attached thereto with screws. The guide block 202 has grooves 204, which slidably embrace a front forming tool 206 and permit vertical motion of the latter. The upper portion of the front forming tool is secured to the piston rod 165 by grooves in each member which receive a key 208.

As shown in Figure 3, a rear forming tool 210 is slidably engaged with the front forming tool 206 and held thereto by a screw 212. The screw 212 passes through a spring 214, a washer 216, and a slot 218 in the rear forming tool and is secured to the front forming tool 206. Accordingly, the forming tools are slidable with respect to each other, and the rear forming tool 210 may move away from the front forming tool compressing the spring 214 in a manner to be described later. As shown in Figures 2 and 3, the rear forming tool is pivotally connected to the piston rod 148 with a pin 220.

In Figure 2, an opening 222 is arranged in the housing 142 to admit air into the chamber below the piston 146. A supply of air under pressure for example, 40 p. s. i., is constantly applied to this opening by way of a connector 224 and a hose 226 from a source 228.

To explain the operation of the inserting tool 140 by example, assume that an electrical component 230 is transferred to the tool, and that the leads of the component rest upon a pair of curved shoulders 232 on the rear forming tool 210 as shown in Figure 2. At this time, air under pressure greater than 40 p. s. i., for example, 80 p. s. i., is admitted to the opening 162 by opening a valve 236. The air at 80 p. s. i. acts upon the pistons 144 and 146 and tends to move them apart, but the piston 144 is prevented from upward movement by the cap 154. Therefore, the piston 146 is moved downwardly against the counter force due to the 40 p. s. i. air in the lower chamber. The air at 80 p. s. i. is also applied through the opening 172 to the groove 171 to act upon the upper piston 144, but the effective area against which the pressure is applied is small and the resultant force is slight. Accordingly, the lower piston 146 moves downwardly until the screw 212 rests upon the lower surface of the slot 218. During this movement, it will be noted that a pair of grooves 239 engages the component leads bending the latter over the rounder shoulders 232. Thus, the leads of the component are now formed for insertion into openings in the board 20.

Since the lower piston cannot move downwardly with respect to the upper piston 144 due to the screw 212 and the slot 218, the size of the chamber formed between the pistons 144 and 146 is fixed, and the air applied through the opening 172 to the groove 170 is effective to act upon the piston 144 and move both pistons downwardly as a unit. As soon as the piston 144 moves away from the cap 154, the air is directly effective upon the large area of the piston face to cause both pistons to move down to the limit where the nut 168 engages the cylinder top 154. When the nut 168 engages the cylinder top, the ends of the component leads are positioned within the openings of the board 20.

It is apparent that the pistons must not move upwardly together since the component leads are secured within portions of the forming tools. Therefore, a short time after the 80 p. s. i. air pressure is removed, the 40 p. s. i. air is effective to move the lower piston 146 upwardly with respect to the upper piston and the front forming tool attached to the lower piston 146 and the rod 165 moves upwardly to the position shown in Figure 4. At this time, attention is called to a cam surface 240 on the front forming tool 206 and a cam surface 242 on the rear forming tool 210. As shown in Figure 5, additional upward movement of the lower piston 146 and the rod 165 cause the cam surfaces 240 and 242 to act as shown in Figure 5 and pivot the rear forming tool 210 away from the component leads. At this time, the pistons have moved together to the limit determined by the pin 212 resting against the upper surface of the slot 218 and the spring 180 is compressed accordingly. Now, due to the connection of the pin 212 at the slot 218 the rods 165 and 148 are locked together, the pistons move upwardly together carrying the forming tools 206 and 210 away from the component in the relative positions shown in Figure 5 until the lower piston 146 is stopped by the stop ring engaging the cylinder. The spring 180 causes the upper piston 144 to engage to housing top 154, and this additional movement disengages the cam surfaces 240 and 242 and restores the parts to the position shown in Figure 2. The apparatus for cyclically controlling the supply of air at 80 p. s. i. to the head is described subsequently.

Figure 6:
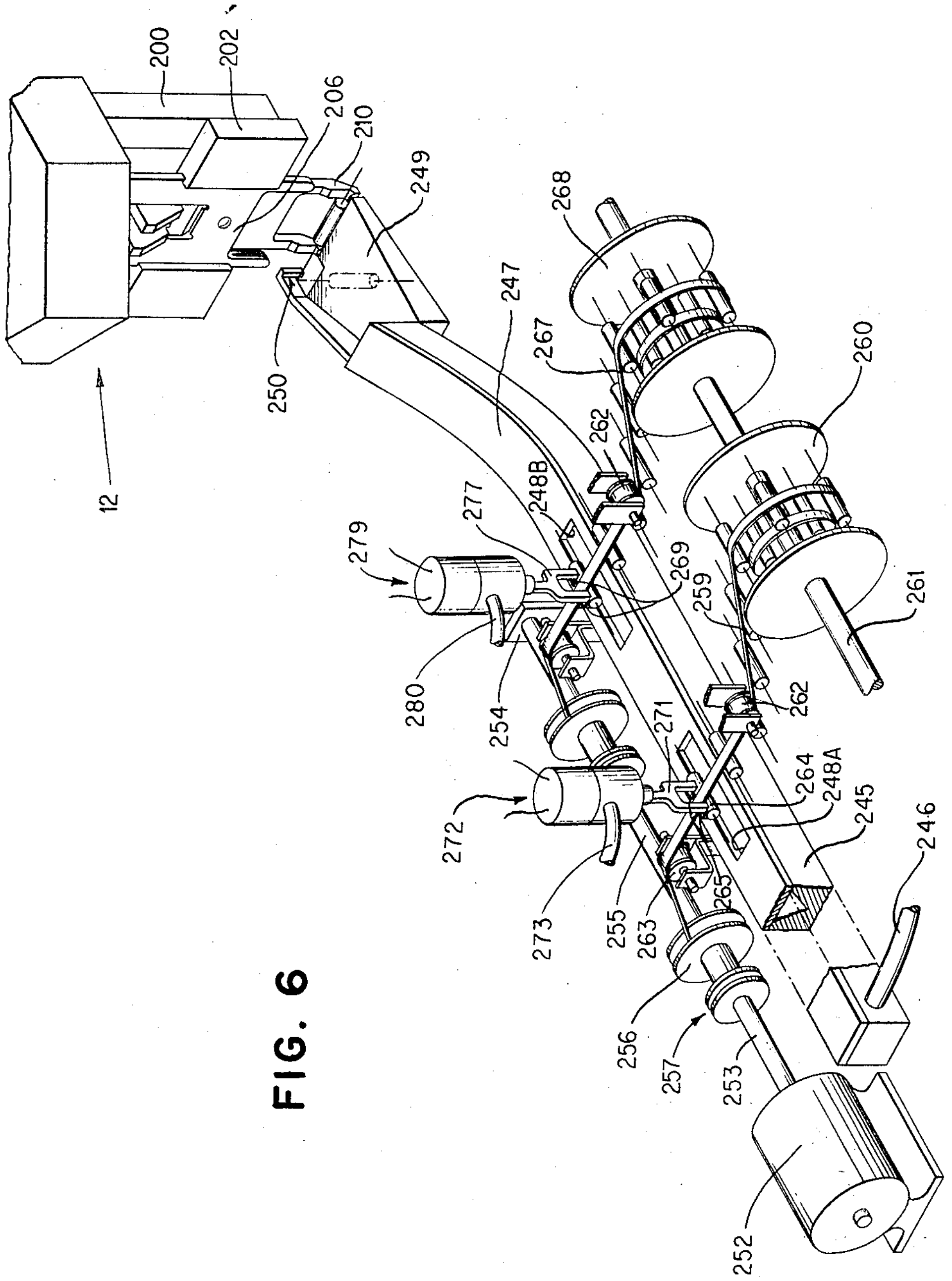
Figure 6 is a perspective view of the component selection and transfer apparatus.

Referring now to Figure 6, the component selection and transfer mechanism of the apparatus is shown, and its orientation with respect to the mechanisms of Figure 1 will be readily apparent by referring to the common inserting tool 12 in each drawing.

An elongated stationary chute 245 of generally V-shaped cross section is used as a conveyor of components to the inserting tool 12. The chute contains an opening at one end to which compressed air is supplied continuously through a tube 246. The air is directed down the chute in such a manner that a component, when deposited within the chute, is blown to the forming tool 210. Various arrangements of ports or passageways terminating within the chute at spaced intervals and directing compressed air along the vertex are feasible to convey components to the tool.

A cover 247 is positioned on top of the chute and generally provides a seal except for a pair of openings 248A and 248B therein which are arranged to admit components. The end of the chute near the tool 210 is open for passage of the components to an orientation device 249 which causes approximately 90° rotation of the component to its final position as shown when engaged with the forming tool 210. The orientation device 249 is positioned with respect to the end of the chute 246 so that the forward end of the component lead is directed into a corner 250. The force of the air together with the kinetic energy of the component causes the latter to pivot about the restrained lead to a position generally parallel to the plane of the forming tool 210. The component moves down a slope at the end of the device 249 to its final position with its leads resting upon the shoulders 232 of the forming tool 210.

A motor 252 is constantly driven in the direction shown when the main switch 122 is "on" and is connected to a shaft 253, the latter being suitably supported in a bearing member 254. A sleeve 255 is rotatably supported on the shaft 253, and a spool 256 is fixed to the sleeve. A slipping clutch 257 couples the shaft 253 to the sleeve 255 to provide a pulling force on a tape 259 secured to the spool 256. Normally, the clutch slips so that the tension on the tape is slight and just sufficient for the purpose described hereafter.

Components of the value X are releasably secured to the tape 259 with an adhesive, and the components and tape are then rolled on a spool 260 which is rotatably supported on a spindle 261 suitably supported at its ends. The free end of the tape is passed under a roller 262 and over a roller 263, and is secured to the spool 256. The components are suspended from the tape as shown, and the first component engages a pair of stops 265 fixed to the cover 247. The force on the tape 259 provided through the clutch 257 is just sufficient to hold the first component against the stops 265 but is not great enough to overcome the adhesive force between the tape and the component.

Components of value Y are carried by a tape 267, and the components and tape are rolled on a rotatable spool 268. A mechanism identical to the one previously described positions the first Y component against stops 269 on the cover 247.

A forked tool 271 engages the first X component on either side of the tape 259. The forked tool is coupled to a piston within a cylinder in the lower portion of the assembly 272, and the piston is biased upwardly by spring means within the cylinder. Compressed air is constantly supplied through a tube 273 to the assembly 272, but a valve operably connected to a solenoid 275 (Figure 7) prevents application of the air to the piston. Upon energization of the solenoid 275, the piston is forced down causing the forked tool 271 to separate the component from the tape and enter the component in the opening 248A. Baffles are provided for the openings 248A and 248B to prevent the air in the chute 245 from blowing the components upwardly. It will be appreciated that when the first X component is released from the tape 259, the tape is taken up about its spool 256 due to the force supplied through the clutch 257 until the next component comes to bear against the stops.

A forked tool 277 engages the first Y component and is operated by an assembly 279 supplied by compressed air through a tube 280 and controlled by a solenoid 282 (Figure 7) in the same way as explained with reference to X component selection mechanism. The details of the mechanism will not be repeated.

Before proceeding to the description of the circuits of Figures 7 and 8, an example of programming will be given with reference to the board and components of Figure 1, which shows the apparatus after insertion of a component of value X in position 5 and a component of value Y in position 12 and before carriage movement to board position 13. Moving backward in time, it is assumed that a component of value X is to be inserted in board position 5 and that a component of value Y is to be inserted in board position 12. Furthermore, the carriage is to operate at its highest speed from the beginning of the feed stroke to the board position 5 and from the board position 6 to the board position 12. After inserting component Y in position 12, the carriage is to return from position 13 since no other components are to be inserted in the board and further movement of the carriage in the feed direction is wasted. To set up the foregoing program, the following switches are placed in the "on" position as indicated in Figures 1 and 7: Insert switches 110-5 and 110-12, the X component switch 116-5, the Y component switch 118-12, the skip switches 114-5 and 114-12, and the carriage return switch 120-13.

The program switches have been set as described above, the carriage 10 is at the extreme left-hand position which is the home position from which the feed stroke begins and the brushes 102, 104 and 106 are beyond their respective "1" positions of the commutators. The board 20 is placed by means not shown in the drawings in a position between the guides 16 and 18 and abutting the block 24.

In Figure 7, there is shown a diagrammatical representation of a stepping switch shown generally as 290. Such switches are well known in the art, and the one illustrated here is representative of a type suitable for use in this apparatus. Briefly, the switch comprises a shaft 291, a pair of wiper arms 292 and 293 insulated from the shaft and rotatable therewith, a toothed wheel 294 fixed to the shaft, a pair of contact assemblies 295 and 296, and means 303 for advancing the wheel 294. The contact assembly 295 comprises 25 spaced segments 295-0 through 295-24 and a common ring 300, all of conductive material. It will be understood that as the wiper arm is advanced it provides an electrical connection between the common ring 300 and the segment determined by the wiper arm position. The contact assembly 296 is identical to the other and comprises segments 296-0 through 296-24 and a common ring 302. The wiper arms 292 and 293 maintain a fixed relationship with each other so that one wiper is on the "1" segment when the other wiper is on its "1" segment.

The segments 295 are connected to the component selection switches 116 and 118 as follows: 295-1 to the 118-1 and 116-1, 295-5 to the 118-5 and 116-5, the 295-12 to the 118-12 and 116-12, and the remaining segments 295 to their corresponding switches in like manner. The segments 296 are connected to the left-hand common of the insert switches 110 as follows: The 296-1 to the 110-1, the 296-5 to the 110-5, the 296-12 to the 110-12, and the remaining segments 296 to their corresponding switches in like manner.

The means 303 for advancing the wheel 294 comprises an armature 304 mounted for reciprocation in guides 306A and 306B and biased to the left by a spring 308 which engages a stop 310 with the guide 306B; a pawl 312 pivotally coupled to the armature 304 and biased toward the wheel 294 by a spring 314; and a magnet 316. When the magnet 316 is energized, the armature 304 is attracted causing the pawl 312 to turn the wheel 294 counterclockwise by an amount slightly more than one tooth. A contact 316A is opened by the magnet 316 at the end of the stroke of the armature 304 thereby deenergizing the magnet 316. The armature 304 is returned to the left by the spring 308, and the pawl 312 pivots counterclockwise as it is moved along the next adjacent tooth until it clears the point of the tooth and drops into the dwell by the urging of the spring 314. In the manner just described, the switch is stepped counterclockwise one contact unit for each magnet pulse. At the beginning of a card feeding and inserting operation, the wiper arms 292 and 293 are in the zero position as shown.

In Figure 8, there are shown four terminals to which a 115 A. C. voltage and a suitable D. C. voltage, for example, 40 volts, are applied when the "on-off" switch 122 (Figure 1) is turned to the "on" position. Depression of the feed key 126 (Figures 1 and 7) energized a feed solenoid 320A of the air valve assembly 32 by way of the positive side of the D. C. line 322, the feed switch 126, the coil of the solenoid 320A, and the negative side of the D. C. line 324. A feed relay 326 is energized in parallel with the solenoid 320. The solenoid 320 operates an air valve in valve assembly 32 (Figure 1) and supplies air under pressure to the left-hand chamber of the air cylinder 30 to cause the carriage 10 to move from left to right. Subsequent deenergization of the solenoid 320 leaves the valve transferred until operation of a carriage return solenoid 320B. The air piston drives the hydraulic rod and piston through the cylinder 63 causing oil to flow through the line 64 as previously described. The check valve 62 is open and the skip valve is open to permit fluid flow at the maximum rate as determined by the setting of the knob 70.

The feed relay 326, now energized, provides a circuit from the negative side of the line 324 through the 326A points, normally open, now closed, to the 296-0 contact of the stepping switch 290, through the wiper 293 to the common ring 302, through the step magnet coil 316 and through the normally closed point 316A to the positive side of the line 322. Accordingly, the wipers 292 and 293 are advanced to their "1" segments.

The stepping switch 290 now provides a test to determine if a component is to be inserted in position 1 of the board dependent upon the condition of the insert switch 110-1 as follows: From the positive side of the line 322, through the 316A contact, the coil 316 to the common ring 302, the wiper 293, the 296-1 segment, the left-hand side of the switch 110–1 in the "off" position, as shown, the line 330, and to the negative side of the line 324. Since the circuit is complete, the step magnet 316 is energized and moves the wipers 292 and 293 to the "2" segments of the stepping switch 290. Since insert switches 110–1 through 110–4 are in the "off" position, the stepping switch moves counterclockwise from position to position in like manner until the wipers come to rest on switch segments 295–5 and 296–5. At this time, there is no voltage applied to the step magnet 316. The circuit is as follows: From the positive side of the line 322, through contacts 316A, the coil 316, the common 302, the wiper, the segment 296–5, the left-hand side of the switch 110–5, a line 332, and to the normally open cam operated contact 380A, now open. Therefore, the step magnet 316 is not energized, the stepping switch remains at position 5, and a component of X value is to be inserted in board position 5. A circuit to the component selection switches 116 and 118 is provided from the positive side of the line 322, through the contacts 320, through the contacts 338A, operated by a cam 338, to the common 300 of the stepping switch, through the wiper 292, through contact 295–5 to the 118–5 switch, not closed, through the 116–5 switch, closed, and through a component selection relay 340 to the negative side of the line. The closing of the contacts 340A energize the solenoid 275 in the assembly 272 (Figure 6) which causes to component of the value X to be released from the tape 259 into the air chute 245 in the manner previously described.

It is pointed out that the stepping switch 290 is asynchronous in operation and begins seeking the first insert position immediately upon activation of the feed switch 126. Thereafter, the stepping switch still advances ahead of the carriage and tests an insert switch before the brushes wipe across the commutator position.

When the brush assembly 106 reaches segment 110–1 of the insert commutator and connects this segment to the common 101, a circuit is not available to energize the check valve 62 to stop the carriage due to the position of the switch 110–1. This is illustrated by the circuit condition as follows: From the positive side of the line 322, through the contacts 320, through a pair of contacts 346A, closed, operated by a cam 346, through a check valve solenoid 348, through a line 349 to the commutator common 101, through the brush assembly 106 and through the 100–1 segment to the switch 110–1, open. The insert switches 110–2 through 4 are in a like state, and the carriage continues to position 5. Skip switches 114–1 through 114–4 are open and, as such, do not operate the skip valve 68 to slow down the carriage. The carriage return switches 120 are open to position 120–13 and have no effect at this time.

When the carriage moves from board position four to five, the skip brush assembly 104 engages the segment 98–5 before the insert brush assembly 106 engages 100–5 segment due to the narrower width of the latter. Thus, a circuit to operate skip solenoid 68 is available from the line 324, through the contacts 320, through the coil of a skip solenoid 360, through a line 362 to the skip common 99, through brush assembly 104 to the 114–5 segment, through the skip switch 114–5, through a line 364 to the negative side of the line 324. Energization of the skip solenoid 360 in skip valve assembly 68 reduces the rate of flow through the transfer tube 64 and slows down the carriage 10. Shortly thereafter, the brush assembly 106 connects the common 101 to the segment 110–5, and a circuit to the check valve solenoid 348 is provided from the line 322 through the contact 320A, through the cam contacts 346A, through the coil 348, through the line 349 to the common 101, through the brush assembly 106, the segment 100–5, through switch 110–5 "on" as shown, and through the line 364 to the negative side of the line. A timing relay 366 is energized in parallel with the check solenoid 348, and its function will be described hereafter. The solenoid 348 closes the valve in the check valve assembly 62 cutting off the flow of oil in the transfer tube 64 which stops the carriage 10 at board position 5 for so long as the cam contact 346A remains closed.

The timing relay 366, which is energized as previously described, closes its 366A contacts and completes a circuit to a clutch magnet 368 from the line 324 through the coil 368 and through the 366A points to the line 322. The 366B points provide A. C. voltage to a motor 370, which is coupled to a shaft (shown diagrammatically as a line 372) by means of a single cycle clutch 374. The clutch 374 is shown diagrammatically and may be any well known type for connecting the shaft 372 to another shaft 375 when the magnet 368 is energized and for decoupling the shafts when the magnet is deenergized. The motor 370 begins to turn and the magnet 368 operates the clutch 374 thereby driving the shaft 375. It will become apparent hereafter that the shaft makes one revolution and comes to rest at a predetermined position each cycle. Cams fixed to the shaft 372 control contacts in the usual way, the timing relations with respect to the rest position of the shaft and to each other being shown in Figure 9. It is pointed out that the cam contacts 338A and 346A are closed at the beginning of each revolution of the shaft and have the durations as specified in Figure 9.

As shown in Figure 9, the contacts 338A are opened by the cam 338 at 36° to deenergize the X component relay 240 and, in turn, the solenoid 342. Since the selected component has been released, the selection synchronizer 290 is now free to seek out the next inserting position, namely, board position 12. At 45° of the cycle, a cam 380 closes a set of contacts 380A to provide a circuit through line 332, through the left-hand side of the switch 110–5, to the stepping switch segment 296–5, through the wiper to the common 302, through the step magnet 316, and through the contacts 316A to the other side of the line. This steps the switch to position 6 and repeated step magnet cycles are taken as previously described until the position 12 is reached when the stepping switch stops due to the switch 110–12 being in the insert position. It is pointed out that the Y component cannot be released to the air chute immediately because the cam operated contact 338 is open from 36° to 355° (Figure 9).

Between 0 and 36° the selected X component is released into the air chute and transferred to the inserting tool, and at 180° a cam 386 closes a pair of contacts 386A to provide a circuit from the line 324, through the coil of the solenoid 338 to the line 322. The solenoid 388 operates an air valve (not shown) to provide air at 80 p. s. i. through the hose 169 to the opening 162 in the piston rod 148 as shown in Figure 2. As described previously, the inserting tool forms the X component leads and inserts the component in board position 5. At 250° the solenoid 388 is deenergized by the opening of the contacts 386A, and a cam 390 closes contacts 390A to provide a circuit from the line 324 through a solenoid 392 to the line 322. The solenoid 392 transfers the valve 236 in the 80 p. s. i. air line to cut off the air to the opening 162 and provide an exhaust for the air leaving the opening as explained previously.

At 290°, the inserting tool is clear of the X component, and the contacts 346A are opened by the cam 346 causing deenergization of the check valve solenoid 348 and the relay 366. With the check valve 62 open, oil may be transferred through the tube 64 and the air cylinder 30 drives the carriage. When the brush assembly 104 leaves the skip segment 98–5, the skip solenoid 360 is deenergized, and the skip valve 68 permits maximum transfer of oil and increased carriage speed. With regard to the relay 366, its deenergization opens the circuits to the clutch magnet 368 and the motor 370 by means of the 366A and 366B points respectively.

At 355°, a circuit is available from line 324, through contact 320 through cam contact 388A to the step switch common 300, through the wiper 292 to the 295–12 segment, through the Y component selection switch 116–12 closed, through a Y component selection relay 400 to the line 324. The Y component selection solenoid 282 in the assembly 279 (Figure 6) is energized through the 400 A points and releases a component of valve Y into the air chute 245. Momentum carries the shaft 375 to the zero degree point as shown in Figure 9 where it is detented in the usual manner.

The carriage 10 is moving at high speed between board positions 5 and 12 since insert switches 110–6 through 110–11 and skip switches 114–6 through 114–11 are "off." When the brush assembly 104 engages the common 99 with skip segment 98–12, the skip solenoid 360 is energized in the manner previously explained through the skip switch 114–12, closed, to reduce the flow through the transfer tube 64 by operation of the valve assembly 68 thereby slowing down the carriage. When the brush 106 engages the common 101 and the insert segment 100–12, a circuit is provided to the check solenoid 348 and the timing relay 366 due to the 110–12 switch being in the "on" position. The carriage is stopped at board position 12, the timing shaft 372 is caused to make one revolution, and the Y component, previously selected, is inserted in the board in the manner described heretofore.

At 45° of the insertion cycle just described, the contacts 380A close and complete a circuit from the line 324 through the line 332, through the left-hand side of the insert switch 110–12 to the 296–12 segment of the stepping switch 290, through the wiper 293 to the common 302, through the step magnet 316 and through the contact 316A to the line 322 causing the stepping switch to advance to position 13. Since the insert switches 110–13 through 110–24 are "off," it will be appreciated that the stepping switch continues to advance due to circuits provided by the insert switches 110 until the carriage begins to return to the home position.

It has been explained that the carriage has moved from board position 12 by release of the check valve, and, according to the program, no further components are to be inserted in the board. Since the remainder of the insert switches 110–13 through 110–24 are in the "off" position, the carriage would normally proceed in the feeding direction in the absence of some other control device. As mentioned previously, the carriage return switch 120–13 has been set in the "on" position, and when the brush 102 engages the common 97 and the 96–13 segment, a circuit is provided from the line 322 to the carriage common 97 through the brush assembly 102 to the 96–13 segment, through the switch 120–13 and through the carriage return solenoid coil 324 to the line 324. The solenoid 324 removes the air under pressure from the left side of the chamber of the cylinder 30 (Figure 1) and applies air under pressure to the right side of the chamber to return the carriage. Since the board is gripped between the guides 16 and 18, the board remains at its most advanced position, and the carriage returns without the board. Upon the feeding of the next board, the first board is advanced by engagement with the latter board. Means not shown in the drawings are provided for removing the completed boards when released by the guides 16 and 18.

Because the brush assemblies wipe the commutators 96, 98 and 100 on the carriage return stroke, it becomes necessary to disable certain of the circuits which would be otherwise energized. Accordingly, a switch 320 operated upon energization of the solenoid 320 in this case removes the D. C. voltage from the cam contacts 338A, 380A, 346A and one side of the skip solenoid 360. Thus, the circuits to the step magnet 316 and the component selection relays 340 and 400 are open, and the circuits to the check solenoid 348 and timing relay 366 are open. However, there is the possibility that the stepping switch has not had sufficient time to return to the zero position, and provision is made to insure its continued advance to that position. A circuit is provided from the line 322, through the 320 contact transferred through a line 410, through the coil of a relay 412 to the line 324. The contacts 412A close and provide a circuit from the line 324, through the 412A contacts closed, through the normally closed contacts 414A of a relay 414, through the step magnet coil 316, and the 316A points to the line 322. The circuit remains closed except for the opening of the contact 316A as described previously, and the stepping switch 290 is advanced until the wiper arms 292 and 293 engage the 295–0 and 296–0 contacts respectively. When the wiper 293 engages the common 302 with the 296–0 contact, a circuit is complete to energize the relay 414. The circuit is as follows: From the 324 line through the 412A points, now closed, through the 414A points, now closed, to the common 302, through the wiper to the 296–0 contact through the 414 coil to the line 322. The relay 414A points open and remove the voltage from the common 302 thereby disabling the circuit to the stepping magnet 316. The carriage is returned to the extreme left-hand position as determined by the member 40 engaging the guides 16 and 18, where it stays until operation of the feed switch 126.

If a carriage return switch has not been set, the carriage 10 moves past the 24th card position whereupon the brush assembly 100 provides a circuit from the line 322 to the common 97 of the return commutator 96, through the brush assembly 102 to a segment 96–27, and through the carriage return solenoid 322 to the line 324.

The return switch 124 is provided to return the carriage at the option of the operator, and when depressed, energizes the return solenoid 322 via line 322, return switch 124, the coil 322 and the line 324.

While hand operated switches have been shown in Figure 1 for entering the program in the machine, it will be understood that such switches are optional and are symbolic of any device of like purpose for completing or opening circuits as heretofore described. Equivalent devices such as relays may be used, which are energized from a sensing device for punched cards in a manner obvious to those skilled in the art. Other record media such as paper or magnetic tape are adaptable to setting the program in the machine by suitable sensing and control devices, and their use is contemplated in the operation of this apparatus.

Although two sets of component selection switches 116, 118 and their related circuits and mechanism have been described, it will be understood that the number is used merely for purposes of illustration and is not to be considered as a limitation since the conrtols and mechanism may be multiplied to provide selection of still other components of other values. Furthermore, printed circuit boards vary in dimensions and number of component-receiving positions, and it is expressly pointed out that obvious modifications and adjustments may be made by those skilled in the art to adapt the apparatus to boards of other configurations.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. Apparatus for assembling components in predetermined ones of a plurality of locations on a board comprising an inserting tool adapted to insert a component at a reference position when operated, means for feeding said board location by location to said reference position, a plurality of settable control devices, each associated with one of said locations, and means actuated in response to the arrival of each location on said board at said position and to the setting of the associated control device for stopping said feeding means and for operating said inserting tool.

2. Apparatus for assembling components at predetermined locations in a printed circuit board comprising an inserting device adapted to move a component to a reference position when operated, means for feeding said board location by location to said reference position, circuit means completed for each component-receiving location, and means actuated in response to the arrival of each location on said board at said reference position and the corresponding circuit means for stopping said feeding means and operating said inserting device to move the component to the board location.

3. Apparatus for assembling components in predetermined ones of a plurality of locations on a board comprising an inserting tool adapted to insert a component in a board location at a reference position when operated, interruptable means for feeding said board location by location to said reference position, a plurality of control devices, one for each one of said component-receiving locations, and means actuated in response to the arrival of each location on said board at said position and to the corresponding control device for interrupting said feeding means and operating said inserting tool.

4. A claim in accordance with claim 3 wherein said last-mentioned means comprises a plurality of operable switches each associated with one of said component-receiving locations, means for interrupting said feeding means, means operating the switch corresponding to the location on said board upon arrival of said location at said positions, means including circuits responsive to operation of said switches for actuating said feed interruption means and for operating said inserting tool.

5. Apparatus for assembling components in predetermined ones of a plurality of positions in a board comprising a tool adapted to form leads of a component in desired direction and spaced relation and to insert a component in the position in the board located in a reference position, controllable means for feeding said board position by position to said reference position, a plurality of settable control devices each associated with one of said positions, and means actuated in response to the arrival of each position in said board at said reference position and to the setting of the associated control device for stopping said feed means and for operating said inserting tool.

6. Apparatus for assembling components in predetermined locations on a board comprising a tool adapted to insert a component at a reference position when operated, means for feeding said board location by location to said reference position, a switch for each location, a circuit-making device for each location operable in response to the arrival of its corresponding location on said board at said position and each device connected in series relation with its corresponding switch, means transferring components individually to said tool for each operation, and means actuated in response to each circuit-making device when its corresponding switch is closed for stopping said feeding means and operating said inserting tool.

7. Apparatus for assembling components of predetermined values in predetermined locations on a board comprising a tool adapted to insert a component at a reference position when operated, means for feeding said board location by location to said reference position, a settable control switch for each location, a circuit making device for each location operable in response to the arrival of its corresponding location on said board at said position and each circuit-making device connected in series relation with its corresponding switch, a program device having groups of settable switches, one switch in each group for each board location, and a group for each value of component, means responsive to said switches of said program device and said control switches when set for selecting the component and transferring the same to said inserting tool, and means actuated in response to each circuit-making device when its corresponding control switch is set for stopping said feeding means and operating said inserting tool.

8. Apparatus for assembling components in predetermined ones of a plurality of locations on a board comprising a component inserting tool operable when energized to insert a component in the board, means successively feeding individual components to said tool, a carriage adapted to receive the board and move the latter in a feeding direction with respect to the inserting tool thereby presenting each location on said board successively to said tool, a commutator having a conductive bar, a plurality of conductive segments, each associated with one location on said board, and a conductive element sequentially connectable with the bar and with individual ones of said segments, controllable means for moving said carriage, means coupling said conductive element to said carriage for movement therewith such that said conductive element engages the segment associated with the location when the latter is presented to the tool, means effective when operated to stop said carriage moving means, and circuit means including a plurality of actuable control elements, each related to an inserting position, and each effective when actuated and when said conductive element engages its respective commutator segment to operate said means effective to stop said carriage and to energize said component inserting tool.

9. Apparatus for assembling components in predetermined ones of a plurality of locations on a board comprising a tool adapted to insert a component in a board location at a reference position when operated, first component selection means providing a component of a first value to said tool when actuated, second component selection means providing a component of a second value to said tool when actuated, a first plurality of operable switches associated with said first means and each associated with one of said locations, a second plurality of operable switches associated with said second means and each associated with one of said locations, means feeding said board location by location to said reference position, means restraining said feeding means when operated, a plurality of settable control devices each associated with one of said locations, means including circuits under control of said control devices when set and said first switches when operated to actuate said first component selection means and circuits under control of said control devices when set and said second switches when operated to actuate said second component selection means, and means actuated in response to the arrival of each location on said board at said reference position and to the associated control device when set for operating said feed restraining means and for operating said tool.

10. Apparatus for assemblying components in predetermined ones of a plurality of locations on a board comprising component selection means including a matrix having rows of storage devices corresponding to each component value, each storage device in each row being individually associated with a respective one of said locations on said board and each operable to select its component when actuated, an inserting tool adapted to insert a component in a board location at a reference position when operated, means feeding said board location by location to said reference position, a plurality of settable control devices, each associated with one of said board locations, means actuated by said control devices when set and said storage devices when actuated to transfer a selected component to said inserting tool in advance of the arrival of the related location at the reference position, and means actuated in response to the arrival of each location on said board at said reference position and to the setting of the associated control device for stopping said feeding means and operating said inserting tool.

11. Apparatus for assembling components of at least two values individually in predetermined positions in a board comprising a tool adapted to insert a component in a board location at a reference position when operated, interruptable means for feeding said board position by position to said reference position, a plurality of settable control devices, each associated with one of said positions, a magazine for holding components of a first value, a magazine for holding components of a second value, means transferring one of the components of the first value to said tool in response to electrical actuation, means transferring one of the components of said second value to said tool in response to electrical actuation, an asynchronous device having an input and a plurality of outputs, each associated with one of said positions in said board, including means connecting said input with one of said outputs in the sequence of said positions in said board but in advance of the arrival of the corresponding position at said reference position, a plurality of operable switches associated with said components of said first value, each associated with one of said board positions and each connected in series with a corresponding one of said outputs and said electrically actuable releasing means for said components of said first value, a plurality of operable switches associated with said components of said second value and each associated with one of said board positions and each connected in series with a corresponding one of said outputs and said electrically actuable releasing means for said components of said second value, means providing a circuit through said effective output of said asynchronous device and through the operated one of the corresponding selection switches to the associated component transfer means, and means actuated in response to the arrival of each position of said board at said reference position and to the setting of the associated control device for interrupting said feeding means and for operating said inserting tool.

12. Apparatus for assembling components of at least two values individually in predetermined positions of a plurality of positions in a board comprising an inserting tool adapted to insert a component at a reference position when operated, interruptable means for feeding said board position by position to said reference position, a plurality of settable control devices, each associated with one of said positions, means actuated in response to the arrival of each position on said board at said reference position and to the setting of the associated control device for interrupting said feeding and for operating said inserting tool, a magazine for holding components of a first value, a magazine for holding components of a second value, means transferring a single one of the components of the first value to said tool in response to electrical actuation, means transferring a single one of the components of said second value to said tool in response to electrical actuation, a stepping switch having an input and a plurality of outputs, each output associated with one of said positions in said board, including means connecting said input with one of said outputs in the sequence of said positions in said board but in advance of the arrival of the corresponding position at said reference position, a plurality of operable switches associated with said components of said first value, each associated with one of said positions and each connected in series with a corresponding one of said outputs and said electrically actuable releasing means for said components of said first value, a plurality of operable switches associated with said components of said second value and each associated with one of said board positions and each connected in series with a corresponding one of said outputs and said electrically actuable releasing means for said components of said second value, and means controlled by said control devices, when set, to provide a circuit through said effective output of said stepping switch and through the operated one of the corresponding selection switches to the associated component transfer means.

References Cited in the file of this patent

UNITED STATES PATENTS

| | | |
|---|---|---|
| 2,304,510 | Rosenmund | Dec. 8, 1942 |
| 2,305,418 | Harred | Dec. 15, 1942 |
| 2,317,298 | Pabich | Apr. 20, 1943 |
| 2,578,936 | Kingsley | Dec. 18, 1951 |
| 2,688,438 | Breese | Sept. 7, 1954 |